United States Patent
Chae

(10) Patent No.: US 7,417,701 B2
(45) Date of Patent: Aug. 26, 2008

(54) ARRAY SUBSTRATE FOR LIQUID CRYSTAL DISPLAY AND METHOD FOR FABRICATING THE SAME HAVING PARTICULAR GATE INSULATING LAYER

(75) Inventor: Gee Sung Chae, Incheon (KR)

(73) Assignee: LG Display Co., Ltd., Seoul (KR)

( * ) Notice: Subject to any disclaimer, the term of this patent is extended or adjusted under 35 U.S.C. 154(b) by 132 days.

(21) Appl. No.: 11/476,882

(22) Filed: Jun. 29, 2006

(65) Prior Publication Data

US 2007/0004070 A1 Jan. 4, 2007

(30) Foreign Application Priority Data

Jun. 30, 2005 (KR) .................. 10-2005-0058874

(51) Int. Cl.
*G02F 1/1333* (2006.01)
*G02F 1/1343* (2006.01)

(52) U.S. Cl. .................. 349/138; 349/158; 349/38; 349/141

(58) Field of Classification Search .......... 349/138, 349/158, 38, 39, 141
See application file for complete search history.

(56) References Cited

U.S. PATENT DOCUMENTS 5,432,626 A * 7/1995 Sasuga et al. ............ 349/58
6,147,667 A * 11/2000 Yamazaki et al. ......... 345/92
6,310,667 B1 * 10/2001 Nakayoshi et al. ........ 349/42
6,524,876 B1 * 2/2003 Baek et al. ............... 438/48
6,849,873 B2 * 2/2005 Baek et al. ............... 257/72

* cited by examiner

*Primary Examiner*—Mike Qi
(74) *Attorney, Agent, or Firm*—Morgan, Lewis & Bockius LLP

(57) ABSTRACT

An array substrate for an LCD includes a substrate, a gate line, a data line, a gate electrode extending from the gate line formed on the substrate, a gate insulating layer covering the gate electrode and the substrate, a semiconductor layer formed over the gate insulating layer, a source electrode formed on the semiconductor layer extending from the data line, a drain electrode formed on the semiconductor layer facing the source electrode, a passivation layer covering the substrate including a resultant structure obtained after the source electrode and the drain electrode are formed, and a pixel electrode contacting the drain electrode through a contact hole passing through the passivation layer, wherein a portion of the gate insulating layer in a region where the gate electrode is formed is thinner than a portion of the gate insulating layer in a region where the gate line and the data line intersect with each other.

12 Claims, 10 Drawing Sheets

ARRAY SUBSTRATE FOR LIQUID CRYSTAL DISPLAY AND METHOD FOR FABRICATING THE SAME HAVING PARTICULAR GATE INSULATING LAYER

The present invention claims the benefit of Korean Patent Application No. 10-2005-0058874 filed in Korea on Jun. 30, 2005, which is hereby incorporated by reference.

BACKGROUND OF THE INVENTION

1. Field of the Invention

The present invention relates to an array substrate for a liquid crystal display (LCD) and a method for fabricating the same, and more particularly, to an array substrate for an LCD with an improved gate insulating layer.

2. Discussion of the Related Art

A liquid crystal display (LCD) is a display apparatus that displays an image through specific configurations and operations. In particular, a liquid material that has dielectric anisotropy is placed between a color filter substrate, which is a transparent insulating substrate typically placed at the top, and an array substrate, which is a transparent insulating substrate typically placed at the bottom. An electric field is generated in the liquid material between the two substrates, and the intensity of the electric field is adjusted so as to change the molecular arrangements of the liquid material. Through the change in the molecular arrangement, the amount of light transmitted to the color filter substrate is adjusted to display a desired image. A thin film transistor liquid crystal display (TFT LCD) that uses a thin film transistor (TFT) as a switching device is one of the typically used LCD.

FIG. 1 is a simplified cross-sectional view illustrating a typical array substrate for an LCD. The array substrate comprises a gate line GL0 and a data line DL0, which define a pixel region by being arranged in the horizontal and vertical directions to intersect with each other. In each pixel region, there is a TFT, which comprises a gate electrode 11, a gate insulating layer 12, a semiconductor layer 13, a source electrode 14, a drain electrode 15, and ohmic contact layers 16_1 and 16_2. The gate insulating layer 12 is formed over the gate electrode 11. The semiconductor layer 13 is formed of undoped amorphous silicon. The source electrode 14 and the drain electrode 15 are disposed apart on opposing sides of the semiconductor layer 13. The ohmic contact layers 16_1 and 16_2 are formed respectively at the interfaces between the source electrode 14 and the semiconductor layer 13 and between the drain electrode 15 and the semiconductor layer 13. A passivation layer 17 is formed over the TFT, and a contact hole 18_1 exposing the drain electrode 15 is formed in the passivation layer 17. A pixel electrode 18 is connected to the drain electrode 15 through the contact hole 18_1 and is formed of a transparent conductive material, such as indium tin oxide (ITO) or indium zinc oxide (IZO).

An overlap capacitor Cov is formed in a region where the gate line GL0 and the data line DL0 intersect with each other. A gate capacitor Cgate is formed between the semiconductor layer 13 and the gate electrode 11. A storage capacitor Cst is formed between a storage electrode 19 and either the drain electrode 15 or the pixel electrode 18 partially overlapped therewith.

In current semiconductor technologies, the function of the gate insulating layer 12 is simplified to insulate metal lines, e.g., the gate line GL0. The gate insulating layer 12 is formed of an organic insulating material such as silicon nitride (SiNx) or silicon oxide (SiOx) instead of an inorganic insulating material. Particularly, using an organic insulating material having low permittivity as the gate insulating layer 12 is one of various attempts to obtain process compatibility.

However, an improvement over current semiconductor technologies utilize the gate insulating layer 12 of the TFT for the LCD as the gate capacitor Cgate for switching and the storage capacitor Cst for storing data signals in addition to the overlap capacitor Cov, which determines inter-layer insulating characteristics of the typical metal lines. More specifically, depending on the position, the gate insulating layer 12 needs to be configured differentially to have low capacitance for use as the overlap capacitor Cov and high capacitance for use as the gate capacitor Cgate or the storage capacitor Cst. Thus, having a uniform permittivity, i.e. a low permittivity, is not sufficient for the purpose of creating different configurations.

The TFT illustrated in FIG. 1 has a gate insulating layer 12 that has the same thickness throughout the entire region. Thus, it may be difficult to obtain different capacitance levels. Furthermore, because gate signals and data signals transmitted through the metal lines, e.g., the gate line GL0 and the data line DL0, may be overlapped with each other, there may be a risk that the gate signals and the data signals get mixed up.

For instance, if the distance between the electrodes is widened to lower the capacitance of the overlap capacitor Cov, a distance between the electrodes of the gate capacitor Cgate or the storage capacitor Cst is also widened. The widened distance between the electrodes generally causes the capacitance to decrease. In such a case, critical dimensions (CD) of a circuit, i.e., the areas of the electrodes, need to be enlarged to maintain the capacitance of the gate capacitor Cgate or the storage capacitor Cst. However, the enlarged CDs may negatively affect an opening ratio. On the other hand, when the distance between the electrodes is narrowed to increase the capacitance of the gate capacitor Cgate or the storage capacitor Cst, the CDs of the gate line GL0 and the data line DL0 need to be narrowed. However, this approach may lead to a short circuit in the gate line GL0 or the data line DL0 or may cause flickering images.

SUMMARY OF THE INVENTION

Accordingly, the present invention is directed to an array substrate for liquid crystal display (LCD) and method for fabricating the same that substantially obviates one or more of the problems due to limitations and disadvantages of the related art.

An object of the present invention is to provide an array substrate for an LCD that can easily obtain position-differentiated capacitance.

Another object of the present invention is to provide a method for fabricating an array substrate for an LCD that can easily obtain position-differentiated capacitance.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an array substrate for a liquid crystal display (LCD) includes a substrate, a gate line, a data line, a gate electrode extending from the gate line formed on the substrate, a gate insulating layer covering the gate electrode and the substrate, a semiconductor layer formed over the gate insulating layer, a source electrode formed on the semiconductor layer extending from the data line, a drain electrode formed on the semiconductor layer facing the source electrode, a passivation layer covering the substrate including a resultant structure obtained after the source electrode and the drain electrode are formed, and a pixel electrode contacting the drain electrode through a contact hole passing through the passivation layer, wherein a portion of the gate insulating layer in a region where the gate electrode is formed is thinner than a portion of the gate insulating layer in a region where the gate line and the data line intersect with each other.

In another aspect, an array substrate for a liquid crystal display (LCD) includes a substrate, a gate line, a data line, a gate electrode extending from the gate line formed on the transparent insulating substrate, a gate insulating layer covering the gate electrode and the transparent insulating substrate, a semiconductor layer formed over the gate insulating layer, a source electrode formed on the semiconductor layer extending from the data line, a drain electrode formed on the semiconductor layer facing the source electrode, a passivation layer covering the substrate including a resultant structure obtained after the source electrode and the drain electrode are formed, a pixel electrode contacting the drain electrode through a contact hole passing through the passivation layer, the pixel electrode having a plurality of first branches, and a common electrode having a plurality of second branches disposed such that the first and second branches are arranged in alternating fashion with a certain distance therebetween, wherein a portion of the gate insulating layer in a region where the gate electrode is formed is thinner than a portion of the gate insulating layer in a region where the gate line and the data line intersect with each other.

In yet another aspect, a method for fabricating an array substrate for a liquid crystal display (LCD) includes forming a gate line and a gate electrode on a substrate, the gate electrode extending from the gate line, forming a gate insulating layer covering the gate electrode and the substrate, the gate insulating layer, forming a semiconductor layer over the gate insulating layer, forming a data line, a source electrode, extending from the data line, and a drain electrode, the source electrode and the drain electrode formed on the semiconductor layer facing each other with the semiconductor layer therebetween, forming a passivation layer on the substrate including a resultant structure obtained after forming the source electrode and the drain electrode, forming a pixel electrode contacting the drain electrode through a contact hole passing through the passivation layer, wherein a portion of the gate insulating layer in a region where the gate electrode is formed is thinner than a portion of the gate insulating layer in a region where the gate line and the data line intersect with each other.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
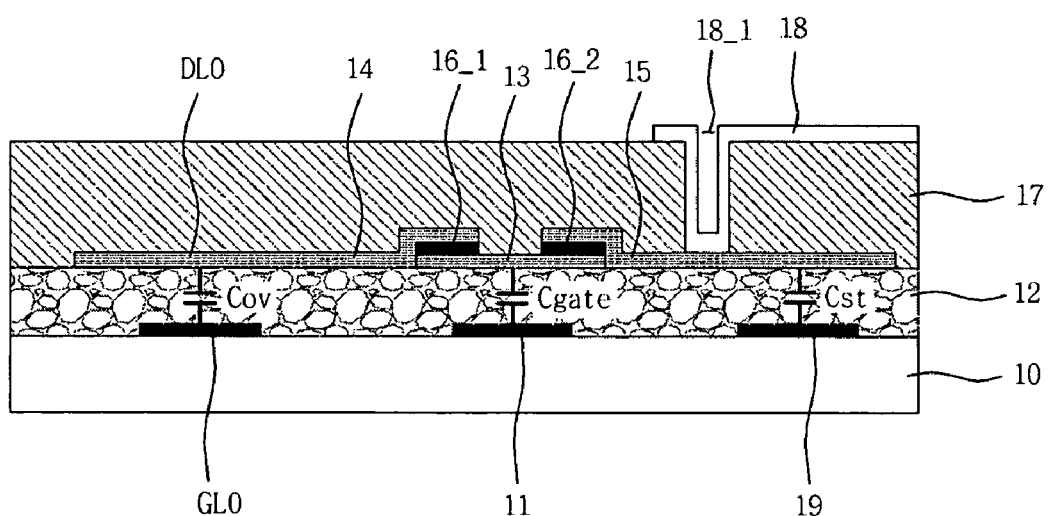
FIG. 1 is a simplified cross-sectional view illustrating an array substrate for a liquid crystal display (LCD) of the related art.
Figure 2:
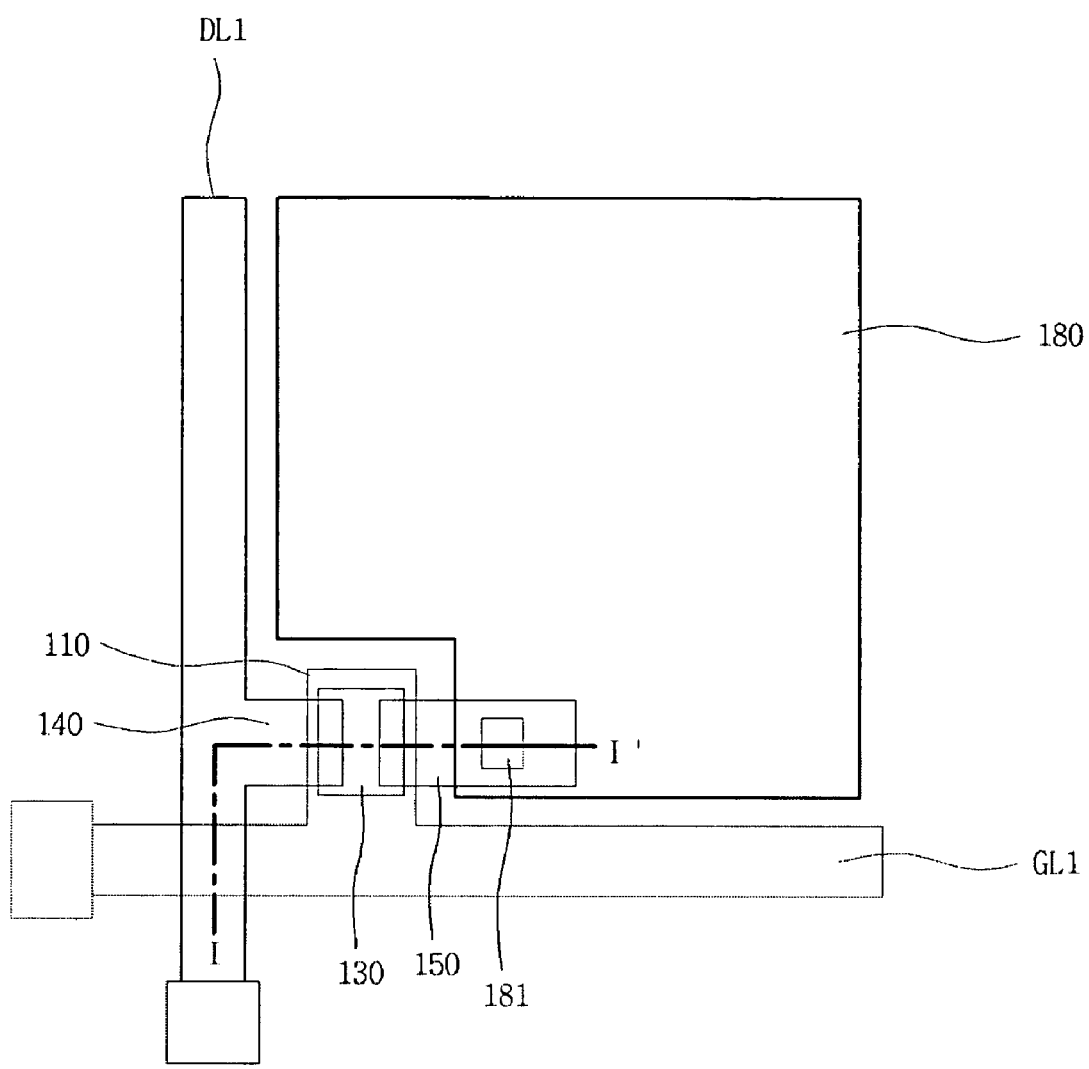
FIG. 2 is a simplified top view illustrating an array substrate for an LCD according to an exemplary embodiment of the present invention.
Figure 3:
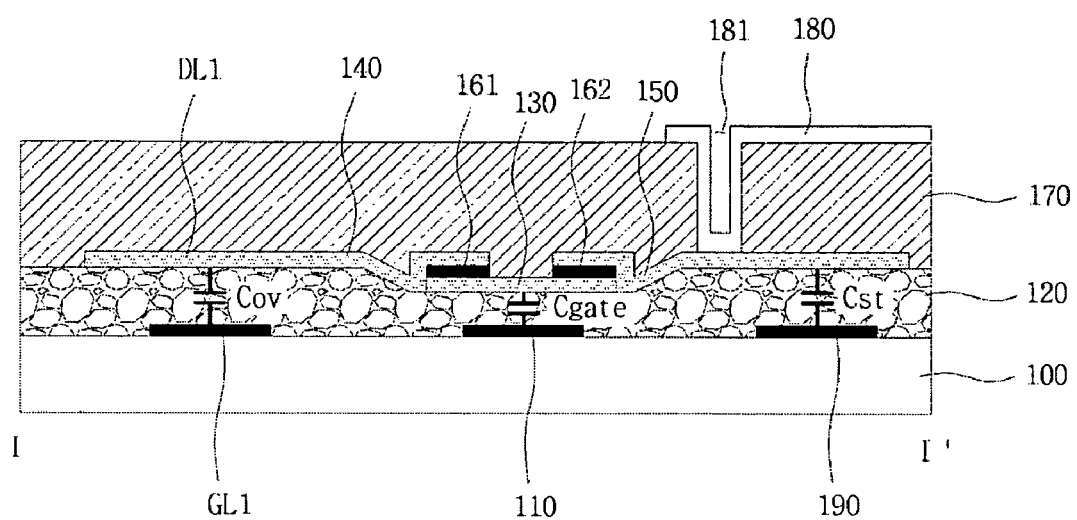
FIG. 3 is a cross-sectional view of the array substrate taken along the line I-I' of FIG. 2.

Detailed description of an array substrate for an LCD according to an embodiment of the present invention will be provided hereinafter with reference to FIGS. 2 and 3. FIG. 2 is a simplified top view illustrating an array substrate for an LCD according to an exemplary embodiment of the present invention. FIG. 3 is a cross-sectional view of the array substrate taken along the line I-I' of FIG. 2. As shown in FIGS. 2 and 3, an array substrate (not shown) for use in a twisted nematic type LCD, for example, includes a gate line GL1 and a data line DL1, which intersect with each other, a gate electrode 110, a gate insulating layer 120, a semiconductor layer 130, a source electrode 140, a drain electrode 150, ohmic contact layers 161 and 162, a passivation layer 170, and a pixel electrode 180. The gate line GL1 is formed of a metal-based material, such as aluminum, and is disposed in a horizontal direction over a transparent insulating substrate 100. The gate electrode 110 extends in the direction from the gate line GL1 to the pixel electrode 180. The gate insulating layer 120 is formed over the entire surface of the transparent insulating substrate 100 and the gate electrode 110, and may be formed of an organic insulating material. A portion of the gate insulating layer 120 is formed to be thin in a region where the gate electrode 110 is formed. The organic insulating material for the gate insulating layer 120 may include a nano-composite. The nano-composite is a composite where nanoparticles of clay serving as reinforcing fillers are dispersed within a high molecular matrix. Particularly, the nano-composite is advantageous because of its dimensional stability, mechanical strength, and shielding characteristics. The semiconductor layer 130 is formed over the portion of the gate insulating layer 120 covering the gate electrode 110, and may be formed of undoped amorphous silicon. Particularly, a portion of the semiconductor layer 130 corresponding to the gate electrode 110 is defined to be a channel portion. The source electrode 140 and the drain electrode 150 are formed of a metal-based material, such as aluminum or chromium, and are disposed to face each other on opposing sides of the semiconductor layer 130. The ohmic contact layers 161 and 162 are formed respectively at the interfaces between the source electrode 140 and the semiconductor layer 130, and between the drain electrode 150 and the semiconductor layer 140. The ohmic contact layers 161 and 162 may be formed of n+-type impurity doped, hydrogenated amorphous silicon. The passivation layer 170 is formed over the source electrode 140 and the drain electrode 150 in a manner to cover the entire surface of the transparent insulating substrate 100. The passivation layer 170 is formed of an insulating material including an organic insulating material or an inorganic insulating material, such as silicon nitride (SiNx) or silicon oxide (SiOx). The pixel electrode 180 contacts the drain electrode 150 through a contact hole 181 that passes through the passivation layer 170, and is formed of a transparent conductive material, such as ITO or IZO.

An overlap capacitor Cov may exist between the gate line GL1 and the data line DL1 that are disposed to intersect with each other over the transparent insulating substrate 100. Also, a gate capacitor Cgate may exist between the semiconductor layer 130 and the gate electrode 110. The overlap capacitor Cov and the gate capacitor Cgate have the capacitance estimated based on the following mathematical equation:

$$C = \in (A/d) \qquad \text{Eq. 1}$$

where reference letters 'C', '∈', 'd', and 'A' denote the capacitance, the permittivity, the distance between the electrodes, and the area of the electrode, respectively. According to the capacitance defined above, even if the gate insulating layer 120 is formed of an organic insulating material having substantially the same permittivity, the capacitance can be changed by adjusting the distance (d) between the electrodes, which is the thickness of the gate insulating layer 120 depending on the relative positions of the electrodes.

Accordingly, a portion of the gate insulating layer 120 in the region where the gate electrode 110 is formed, i.e., the portion of the gate insulating layer 120 where the gate capacitor Cgate is formed, is made thinner than the portion of the gate insulating layer 120 where the overlap capacitor Cov is formed in the intersection region between the gate line GL1 and the data line DL1. As a result, the gate capacitor Cgate has a capacitance that is higher than the overlap capacitor Cov. For example, the thickness of the portion of the gate insulating layer 120 where the gate capacitor Cgate is formed may range from approximately 0.4 μm to approximately 1 μm, while the thickness of the portion of the gate insulating layer 120 where the overlap capacitor Cov is formed may range from approximately 1 μm to approximately 2 μm.

An organic dielectric material having an appropriate dielectric constant is used to form the gate insulating layer 120. In addition, the thickness of the organic dielectric material is adjusted to allow a selective adjustment of the capacitance depending on the position of the gate insulating layer 120. Accordingly, both low capacitance to insulate the interlayer metal lines and high capacitance for a function of the gate insulating layer 120 can be obtained simultaneously.

A storage capacitor Cst exists between the drain or pixel electrode 150 or 180 and a storage electrode 190 partially overlapped therewith over the transparent insulating substrate 100. For purposes of example the storage electrode 190 and the drain electrode 150 are shown to overlap over the transparent insulating substrate 100 to form the storage capacitor Cst in FIG. 3. It is to be understood that the position of the storage electrode 190 is not limited as illustrated in FIG. 3. For example, a front terminal that overlaps with a portion of the pixel electrode 180, e.g., the gate line, may also be used as the storage electrode 190.

Although not shown, a portion of the gate insulating layer 120 over the storage electrode 190 may also be made thin to increase the capacitance of the storage capacitor Cst, which requires high capacitance. In this case, the gate insulating layer 120 is formed to have substantially the same thickness in the regions where the gate capacitor Cgate and the storage capacitor Cst are formed. These portions of the gate insulating layer 120 are formed to be thinner than the portion of the gate insulating layer 120 where the overlap capacitor Cov is formed.

Figure 4:
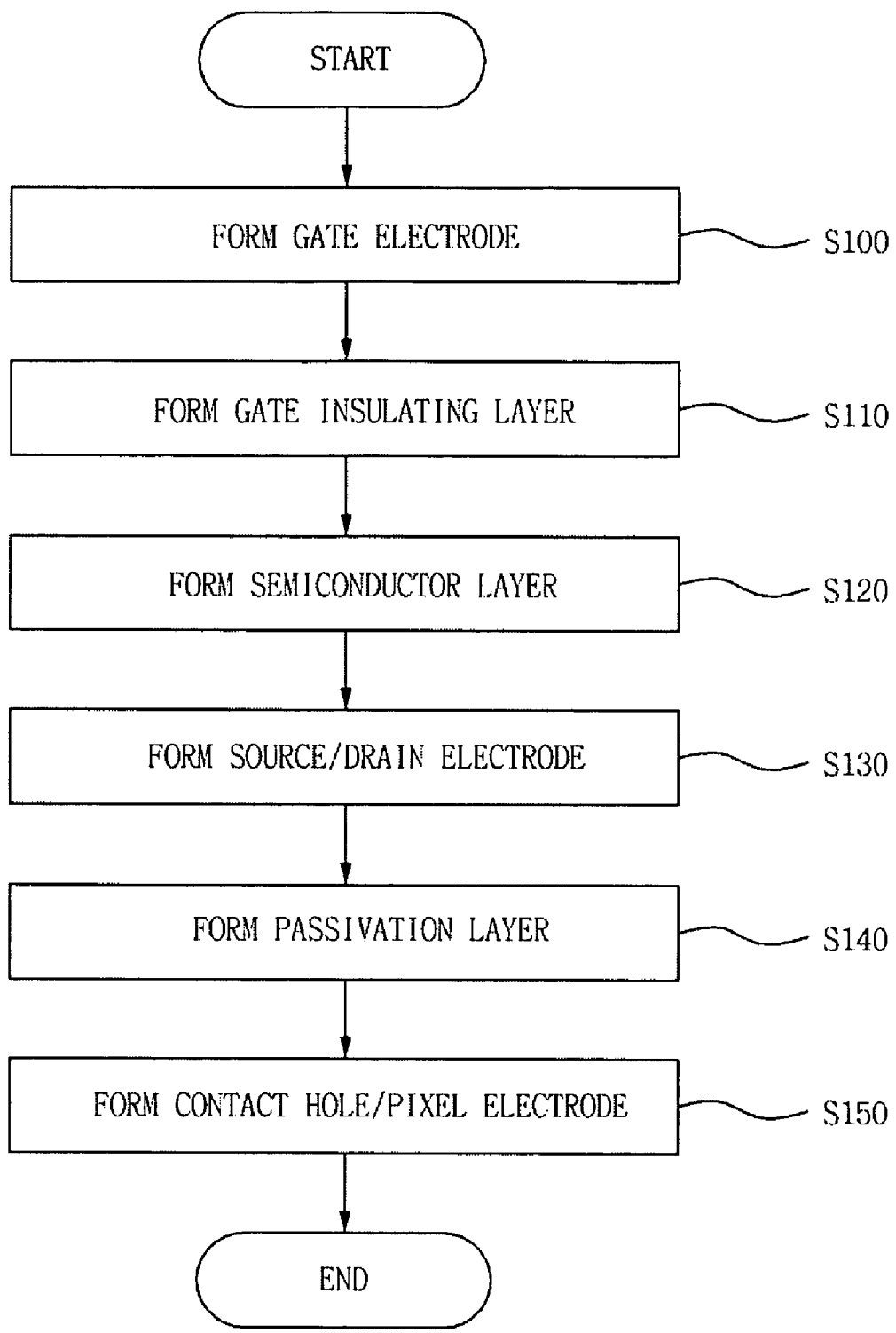
FIG. 4 is a flow chart illustrating a method for fabricating an array substrate for an LCD according to an exemplary embodiment of the present invention.
Figure 5:
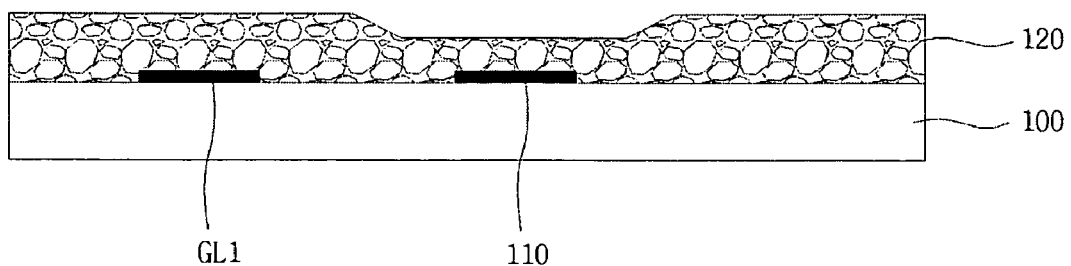
FIGS. 5 to 7 are cross-sectional views illustrating exemplary partial operations of the fabrication method illustrated in FIG. 4.
Figure 6:
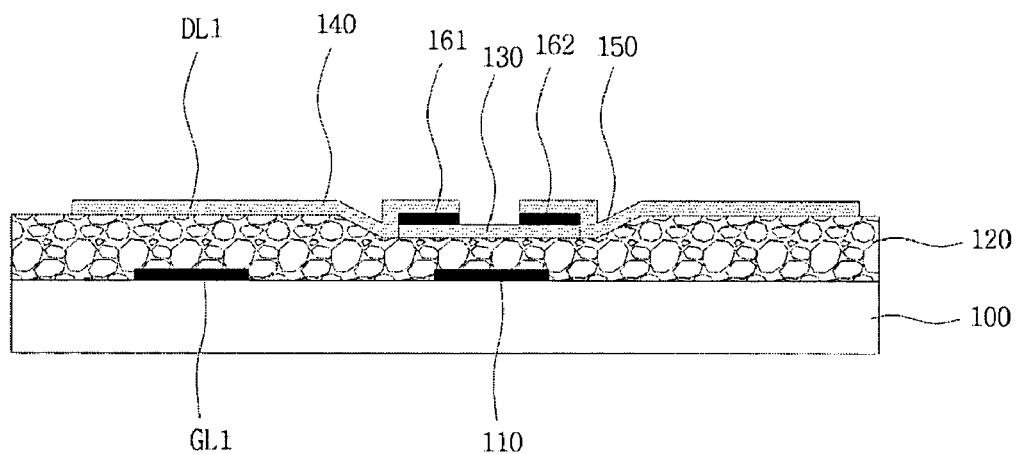
Figure 7:
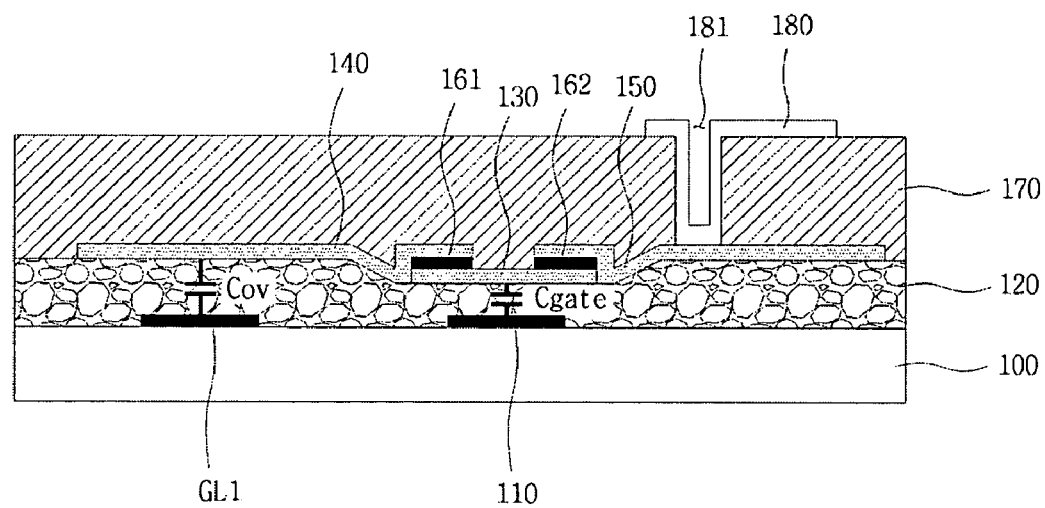

Hereinafter, a method for fabricating an array substrate for an LCD according to an exemplary embodiment of the present invention will be described with reference to FIGS. 4 to 11. FIG. 4 is a flow chart illustrating the method for fabricating the array substrate according to the embodiment of the present invention. The array substrate fabricated according to the exemplary embodiment of the present invention is substantially the same as the array substrate illustrated in FIG. 3. FIGS. 5 to 7 are cross-sectional views illustrating exemplary partial operations of the method described in FIG. 4. Particularly, FIGS. 5 to 7 illustrate exemplary resultant array substrate structures obtained from the operations S110, S130, and S150 described in FIG. 4.

In the operation S100, a gate line GL1 and a gate electrode 110 extending from the gate line GL1 are formed over a transparent insulating substrate 100. A storage electrode 190 is formed over the transparent insulating substrate 100 substantially at the same level where the gate electrode 110 is formed. This structural arrangement makes the storage electrode 190 overlap with a portion of a pixel electrode 180 or a drain electrode 150, which will be formed at a later time. As a result, a storage capacitor Cst can be obtained. In the operation S110, a gate insulating layer 120 is formed over the entire surface of the transparent insulating substrate 100 and the gate electrode 110. The gate insulating layer 120 may be formed of an organic insulating material. As illustrated in FIG. 5, the gate insulating layer 120 is formed with different thicknesses depending on the position. Particularly, a portion of the gate insulating layer 120 is formed to be thin in a region where the gate electrode 110 is formed.

For instance, in the region where the gate electrode 110 is formed, i.e., in the region where a gate capacitor Cgate is to be formed, the portion of the gate insulating layer 120 is molded to have a thickness ranging from approximately 0.4 μm to approximately 1 μm, for example. In a region where an overlap capacitor Cov is formed, i.e., in the region where the gate line GL1 and the data line DL1 intersect with each other, a portion of the gate insulating layer 120 is molded to have a thickness ranging from approximately 1 μm to approximately 2 μm, for example. At this point, the organic insulating material used for the gate insulating layer 120 may include a nano-composite. Also, in a region where the storage capacitor Cst is formed, a portion of the gate insulating layer 120 may be formed to have substantially the same thickness as the portion thereof in the region where the gate capacitor Cgate is formed. In this case, the gate capacitor Cgate and the storage capacitor Cst may have a capacitance different from the capacitance of the overlap capacitor Cov. In the operation S120, a semiconductor layer 130 is formed over the portion of the gate insulating layer 120 corresponding to the gate electrode 110. In the operation S130, the aforementioned data line DL1 is formed to intersect with the gate line GL1. Further, a source electrode 140 and a drain electrode 150 are formed, as illustrated in FIG. 6. The source electrode 140 extends from the data line DL1, while the drain electrode 150 faces to the source electrode 140 by having the semiconductor layer 130 therebetween. Ohmic contact layers 161 and 162 are formed respectively at the interfaces between the source electrode 140 with the semiconductor layer 130, and between the drain electrode 150 and the semiconductor layer 130. In the operation S140, a passivation layer 170 is formed to cover the entire surface of the transparent insulating substrate 100 in which the source electrode 140 and the drain electrode 150 are previously formed. In the operation S150, a contact hole 181 is formed to pass through the passivation layer 170, and a pixel electrode 180 is formed to contact the drain electrode 150 through the contact hole 181, as illustrated in FIG. 7.

Figure 8:
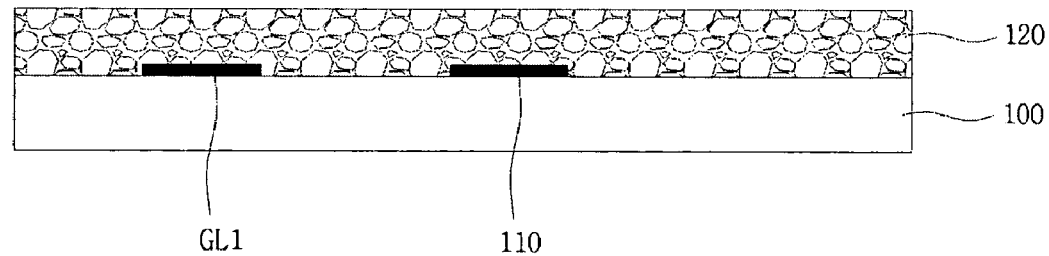
FIGS. 8 to 11 are detailed cross-sectional views illustrating exemplary partial operations of the fabrication method illustrated in FIG. 4.

FIGS. 8 to 11 are detailed cross-sectional views illustrating exemplary partial operations of the fabrication method described in FIG. 4. Particularly, FIGS. 8 to 11 illustrate sub-operations of the operation S110 forming the gate insulating layer 120. As illustrated in FIG. 8, the gate insulating layer 120 is coated over the transparent insulating substrate 100 where the gate line GL1 and the gate electrode 110 are previously formed. The gate insulating layer 120 may be formed of an organic insulating material.

Figure 9:
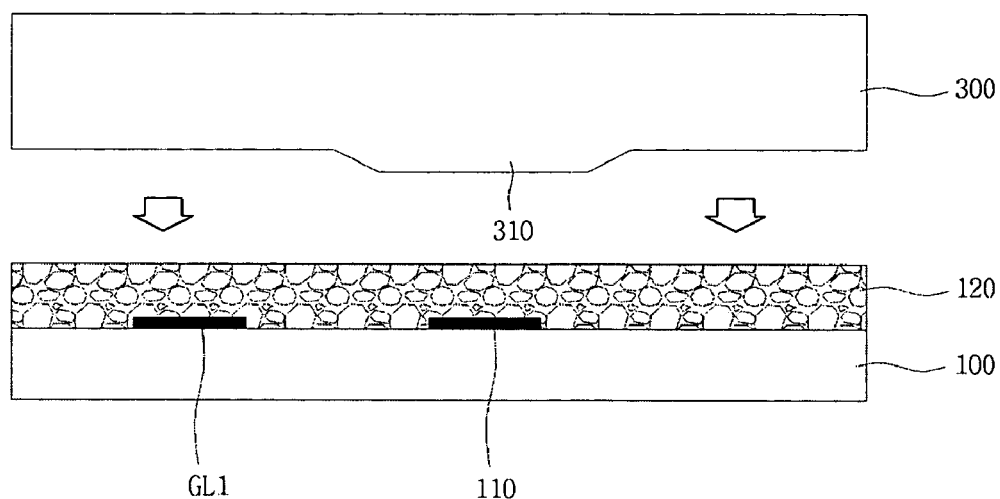

As illustrated in FIG. 9, the gate insulating layer 120 is molded using a template 300 before the coated gate insulating layer 120 is hardened. Thus, the gate insulating layer 120 can be formed having different thicknesses depending on the position without using an additional mask. The template 300 have a protruding portion 310, which contacts the portion of the gate insulating layer 120 corresponding to the gate electrode 110 during the molding operation. The molding takes place by a repulsive force between the coated gate insulating layer 120 and the template 300. The template 300 may be formed of polydimethylsiloxane (PDMS), which is a synthetic rubber that has a repulsive force. Thus, after a stamping operation, the portion of the gate insulating layer 120 over which the protruding portion 310 is disposed becomes thinner than the other portions of the gate insulating layer 120. As a result, even if the gate insulating layer 120 is formed using an organic insulating material having substantially the same permittivity, the capacitance can be selectively adjusted because the gate insulating layer 120 can be formed with different thicknesses.

Figure 10:
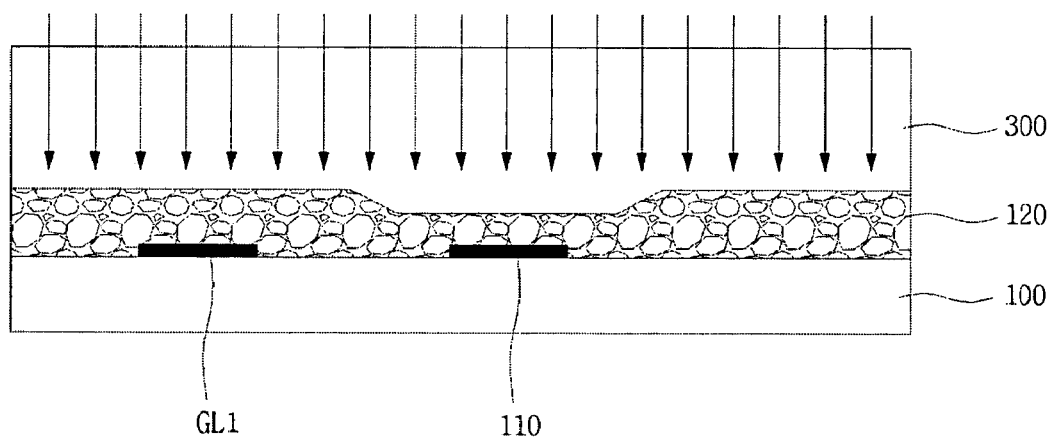
Figure 11:
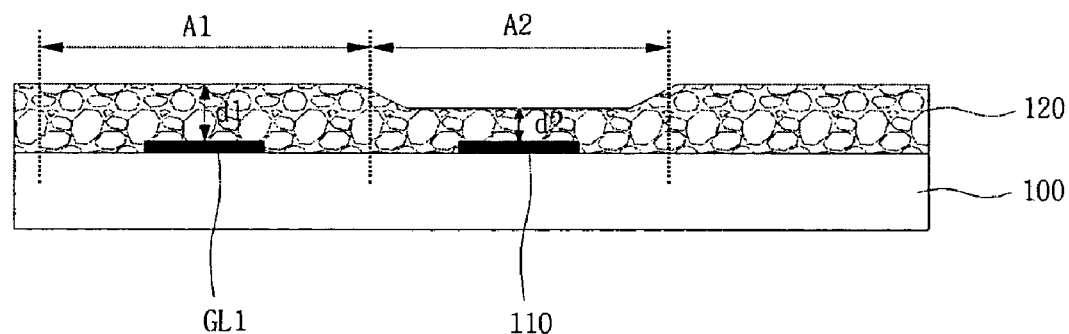

As illustrated in FIG. 10, the molded gate insulating layer 120 is exposed to ultraviolet light to be hardened. After the sequential operations as described above, as illustrated in FIG. 11, a portion A2 of the gate insulating layer 120, corresponding to a location of the gate capacitor Cgate with respect to the gate electrode 110 has a thickness d2 that is smaller than the thickness d1 of a portion A1 of the gate insulating layer 120 corresponding to a location of the overlap capacitor Cov with respect to the region where the gate line GL1 and the data line DL1 intersect with each other. As a result, the capacitance of the gate capacitor Cgate increases, while the capacitance of the overlap capacitor Cov decreases.

Figure 12:
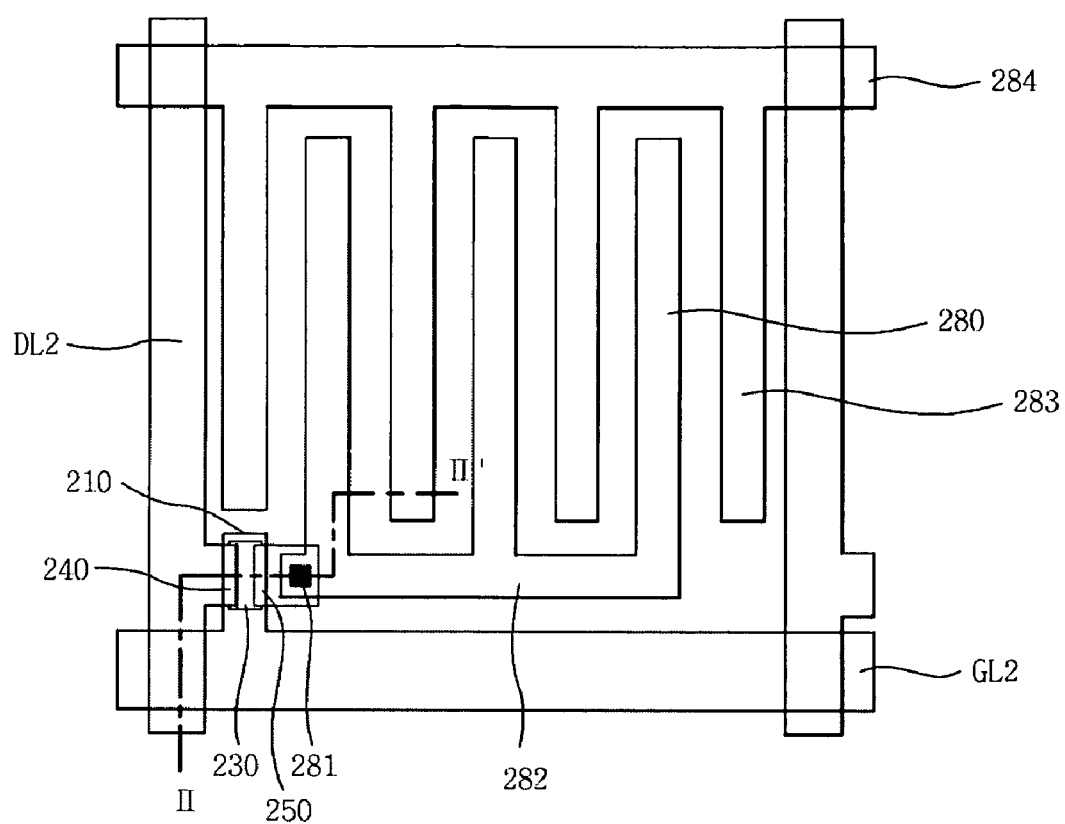
FIG. 12 is a simplified top view illustrating an array substrate for an LCD according to another exemplary embodiment of the present invention.
Figure 13:
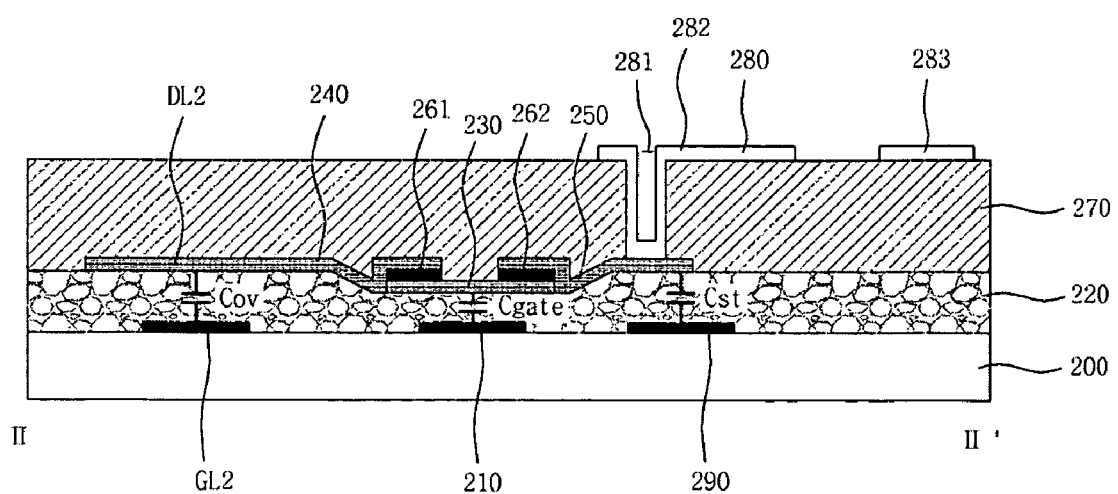
FIG. 13 is a cross-sectional view of the array substrate taken along the line II-II' of FIG. 12.

Hereinafter, an array substrate for an LCD according to another exemplary embodiment of the present invention will be described with reference to FIGS. 12 and 13. FIG. 12 is a simplified top view illustrating the array substrate of an LCD according to another exemplary embodiment of the present invention. FIG. 13 is a cross-sectional view of the exemplary array substrate taken along the line II-II' of FIG. 12. In particular, the array substrate according to the other exemplary embodiment of the present invention is used in an in-plane switching type LCD.

As illustrated in FIGS. 12 and 13, pixel regions defined by gate lines GL2 and data lines DL2, which are arranged to intersect with each other, are configured to be in one frame. In FIG. 12, the array substrate includes the gate lines GL2, the data lines DL2, pixel electrodes 280, and common electrodes 283, all being formed over a transparent insulating substrate 200. More specifically, the gate line GL2 is formed in a horizontal direction, and a gate electrode 120 is formed to extend from the gate line GL2. A common line 284 is formed to run parallel to the gate line GL2. The data line DL2 is formed perpendicular to the gate line GL2 such that the gate line GL2 and the data line DL2 intersect with each other. A source electrode 240 extends from a region of the data line DL2 where the gate electrode 210 is formed. A drain electrode 250 is formed to face the source electrode 240 with a semiconductor layer 230 therebetween, which is formed over the gate electrode 210 between the drain electrode 250 and the source electrode 240. An input/output line 282 is formed to contact the drain electrode 250 through a contact hole 281, and the pixel electrodes 280 are branched off from the input/output line 282. The gate electrode 210, the semiconductor layer 230, the source electrode 240, and the drain electrode 250 form a TFT that performs a switching operation. A portion of the input/output line 282 is electrically coupled with the drain electrode 250 of the TFT through the contact hole 281. The common electrodes 283 branched off from the common line 284 and the pixel electrodes 280 branched off from the input/output line 282 are arranged in alternating fashion with a certain distance therebetween. With this structural arrangement, a horizontally oriented electric field is generated when the TFT performs the switching operation.

As shown in FIG. 13, which illustrates a cross-sectional view of the exemplary array substrate of FIG. 12, the gate line GL2 and the gate electrode 210 are formed over the transparent insulating substrate 200. The gate insulating layer 220 is formed to cover the transparent insulating substrate 200 where the gate electrode 210 and the gate line GL2 are previously formed. The semiconductor layer 230 is formed over a portion of the gate insulating layer 220 corresponding to the gate electrode 210, and the source electrode 240 and the drain electrode 250 are formed on opposing sides of the semiconductor layer 230. After these sequential operations, the TFT is obtained. The data line DL2 is formed to intersect with the gate line GL2. Ohmic contact layers 261 and 262 are interposed respectively between the semiconductor layer 230 and the source electrode 240, and between the semiconductor layer 230 and the drain electrode 250. A passivation layer 270 is formed over the TFT and the data line DL2. The input/output line 282 and the pixel electrodes 280 are formed over the passivation layer 270. At this point, the input/output line 282 and the pixel electrodes 280 contact the drain electrode 250 of the TFT through the contact hole 281. The input/output line 282 and the pixel electrodes 280 are formed of a transparent conductive material, such as ITO or IZO.

A region where the data line DL2 and the gate line GL2 intersect with each other may become an overlap capacitor Cov, and a gate capacitor Cgate may exist between the semiconductor layer 230 and the gate electrode 210. The gate insulating layer 220 may be formed of an organic insulating material including a nano-composite. A portion of the gate insulating layer 220 in the region where the gate capacitor Cgate exists is formed to be thinner than the portion of the gate insulating layer 220 in the region where the overlap capacitor Cov exists. For instance, the portion of the gate insulating layer 220 in the region where the gate capacitor Cgate is formed may have a thickness ranging from approximately 0.4 µm to approximately 1 µm. In the region where the overlap capacitor Cov is formed, the portion of the gate insulating layer 220 may have a thickness ranging from approximately 1 µm to approximately 2 µm. As a result, the gate insulating layer 220 can have different levels of capacitance due to different thicknesses.

A storage electrode 290 is formed over the transparent insulating substrate 200 such that the storage electrode 290 overlaps with a portion of the drain electrode 250 or the corresponding pixel electrode 280. With this structural arrangement, a storage capacitor Cst is obtained. The storage capacitor Cst requires high capacitance similar to the requirement for the gate capacitor Cgate. Accordingly, the distance between the storage electrode 290 and one of the drain electrode 250 and the corresponding pixel electrode 280 may be decreased. By doing so, the gate insulating layer 220 in the region where the storage capacitor Cst exists may be formed to be thinner than the gate insulating layer 220 in the region where the overlap capacitor Cov exists (not illustrated in FIG. 13). According to the above described exemplary embodiments of the present invention, an array substrate for an LCD having different capacitances can be obtained.

It will be apparent to those skilled in the art that various modifications and variations can be made in the array substrate for liquid crystal display and method for fabricating the same of the present invention without departing from the spirit or scope of the invention. Thus, it is intended that the present invention cover the modifications and variations of this invention provided they come within the scope of the appended claims and their equivalents.

What is claimed is:

1. An array substrate for a liquid crystal display (LCD), comprising:
   a substrate;
   a gate line;
   a data line;
   a gate electrode extending from the gate line formed on the substrate;
   a gate insulating layer covering the gate electrode and the substrate;
   a semiconductor layer formed over the gate insulating layer;
   a source electrode formed on the semiconductor layer extending from the data line;
   a drain electrode formed on the semiconductor layer facing the source electrode;
   a passivation layer covering the substrate including a resultant structure obtained after the source electrode and the drain electrode are formed; and
   a pixel electrode contacting the drain electrode through a contact hole passing through the passivation layer,
   wherein a portion of the gate insulating layer in a region where the gate electrode is formed is thinner than a portion of the gate insulating layer in a region where the gate line and the data line intersect with each other.

2. The array substrate of claim 1, wherein the gate insulating layer includes an organic insulating material.

3. The array substrate of claim 2, wherein the organic insulating material includes a nano-composite.

4. The array substrate of claim 1, wherein the portion of the gate insulating layer in the region where the gate electrode is formed has a thickness ranging from about 0.4 μm to about 1 μm.

5. The array substrate of claim 1, wherein the portion of the gate insulating layer in the region where the gate line and the data line intersect with each other has a thickness ranging from about 1 μm to about 2 μm.

6. The array substrate of claim 1, further comprising a storage electrode formed on the substrate and overlapped with a portion of the pixel electrode or the drain electrode to form a storage capacitor, wherein a portion of the gate insulating layer in a region where the storage electrode is formed has substantially the same thickness as the portion of the gate insulating layer in the region where the gate electrode is formed.

7. An array substrate for a liquid crystal display (LCD), comprising:
   a substrate;
   a gate line;
   a data line;
   a gate electrode extending from the gate line formed on the transparent insulating substrate;
   a gate insulating layer covering the gate electrode and the transparent insulating substrate;
   a semiconductor layer formed over the gate insulating layer;
   a source electrode formed on the semiconductor layer extending from the data line;
   a drain electrode formed on the semiconductor layer facing the source electrode;
   a passivation layer covering the substrate including a resultant structure obtained after the source electrode and the drain electrode are formed;
   a pixel electrode contacting the drain electrode through a contact hole passing through the passivation layer, the pixel electrode having a plurality of first branches; and
   a common electrode having a plurality of second branches disposed such that the first and second branches are arranged in alternating fashion with a certain distance therebetween, wherein a portion of the gate insulating layer in a region where the gate electrode is formed is thinner than a portion of the gate insulating layer in a region where the gate line and the data line intersect with each other.

8. The array substrate of claim 7, wherein the gate insulating layer includes an organic insulating material.

9. The array substrate of claim 8, wherein the organic insulating material includes a nano-composite.

10. The array substrate of claim 7, wherein the portion of the gate insulating layer in the region where the gate electrode is formed has a thickness ranging from about 0.4 μm to about 1 μm.

11. The array substrate of claim 7, wherein the portion of the gate insulating layer in the region where the gate line and the data line intersect with each other has a thickness ranging from about 1 μm to about 2 μm.

12. The array substrate of claim 7, further comprising a storage electrode formed on the substrate and overlapped with a portion of the pixel electrode or the drain electrode to form a storage capacitor, wherein a portion of the gate insulating layer in a region where the storage electrode is formed has substantially the same thickness as the portion of the gate insulating layer in the region where the gate electrode is formed.

* * * * *